US007015852B1

(12) United States Patent
Atris et al.

(10) Patent No.: US 7,015,852 B1
(45) Date of Patent: Mar. 21, 2006

(54) CYCLIC ANALOG-TO-DIGITAL CONVERTER

(75) Inventors: Youssef H. Atris, Gilbert, AZ (US); Brandt Braswell, Chandler, AZ (US); Douglas A. Garrity, Gilbert, AZ (US); Zhou Zhixu, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/001,209

(22) Filed: Nov. 30, 2004

(51) Int. Cl.
*H03M 1/12* (2006.01)

(52) U.S. Cl. ....................................... 341/155; 341/163

(58) Field of Classification Search ................ 341/155, 341/163, 156
See application file for complete search history.

(56) References Cited

U.S. PATENT DOCUMENTS

| | | | | |
|---|---|---|---|---|
| 5,633,640 | A | 5/1997 | Barker et al. | |
| 6,147,522 | A | 11/2000 | Rhode et al. | |
| 6,512,472 | B1 * | 1/2003 | Smith et al. | 341/155 |
| 6,653,966 | B1 * | 11/2003 | van der Goes et al. | 341/156 |
| 6,940,445 | B1 * | 9/2005 | Kearney | 341/163 |

* cited by examiner

*Primary Examiner*—Jean Bruner Jeanglaude
(74) *Attorney, Agent, or Firm*—Ingrassia, Fisher & Lorenz, P.C.

(57) ABSTRACT

A method and apparatus are provided for reducing the size and power of cyclic analog-to-digital converter (ADC) conversion circuits. During each cycle, the ADC conversion circuit generates a plurality of bits. The improved ADC includes a scaling/reference circuit having a single operational amplifier which operates in a reference generation mode and an analog multiplexing mode during generation of the first bit and operates in the analog multiplexing mode during generation of the subsequent bits.

18 Claims, 5 Drawing Sheets

36

CYCLIC ANALOG-TO-DIGITAL CONVERTER

FIELD OF THE INVENTION

The present invention generally relates to analog-to-digital converters, and more particularly relates to a method and apparatus for an improved cyclic analog-to-digital converter.

BACKGROUND OF THE INVENTION

Data conversion circuitry that converts analog signals into digital signals for processing by a digital signal processor is well known to those skilled in the art. There are a variety of circuits and techniques that may be used for analog-to-digital (A/D) conversion. In addition it is well-known to use A/D circuits for housekeeping chores in devices such as receiving signals from various sensors and converting those signals into digital signals for interpretation and utilization by a controller. For example, in portable electronic devices such as cellular telephones, A/D circuits could be used for housekeeping chores such as monitoring the battery voltage and/or the battery current, monitoring the charging voltage, monitoring die temperature or monitoring touchscreen pressure points. Cyclic A/D circuits, such as redundant signed digit (RSD) cyclic A/D circuits, are suitable for such housekeeping chores.

As can be easily understood, there could be a large number of housekeeping cyclic A/D circuits. Each cyclic A/D circuit consumes power and takes up space. Portable electronic devices are becoming smaller and smaller and have limited power, therefore size and power have become critical design parameters. Thus, what is needed is an improved cyclic A/D circuit with reduced size and reduced power consumption.

BRIEF SUMMARY OF THE INVENTION

An improved analog-to-digital conversion circuit is provided reducing both the size and the power consumption thereof. The analog-to-digital conversion circuit includes a scaling/reference circuit selectably couplable between a first input and a second input for generating an output in response to at least one of the first input and second input, an analog-to-digital converter (ADC) coupled to the scaling/reference circuit for receiving the output therefrom and generating a digital housekeeping signal in response to the output and ADC control circuitry coupled to the scaling/reference circuit and the ADC for controlling the operation thereof. The scaling/reference circuit includes an operational amplifier selectably couplable between the first and second inputs for operating in a reference generation mode and an analog multiplexing mode and a plurality of switching elements coupled to the input and the output of the operational amplifier. The ADC control circuitry is coupled to the plurality of switching elements for operating the scaling/reference circuit during an ADC conversion time having a plurality of phases by coupling and uncoupling various ones of the plurality of switching elements to and from the operational amplifier to operate the operational amplifier in the reference generation mode and the analog multiplexing mode during a first of the plurality of phases and to operate the operational amplifier in the analog multiplexing mode during subsequent ones of the plurality of phases.

A method is provided for analog-to-digital conversion in a cyclic analog-to-digital (ADC) conversion circuit having both reduced size and reduced power consumption. The ADC conversion circuit has an input and an output where the input is selectable between a stable reference input and an analog multiplexer input and includes a scaling/reference circuit having an operational amplifier capable of operating in both a reference voltage generation mode and an analog multiplexing mode. The ADC conversion circuit also has an ADC conversion time comprising a plurality of phases. The method includes the steps of during a first of the plurality of phases operating the operational amplifier in the reference generation mode and the analog multiplexing mode, and during subsequent ones of the plurality of phases operating the operational amplifier in the analog multiplexing mode.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
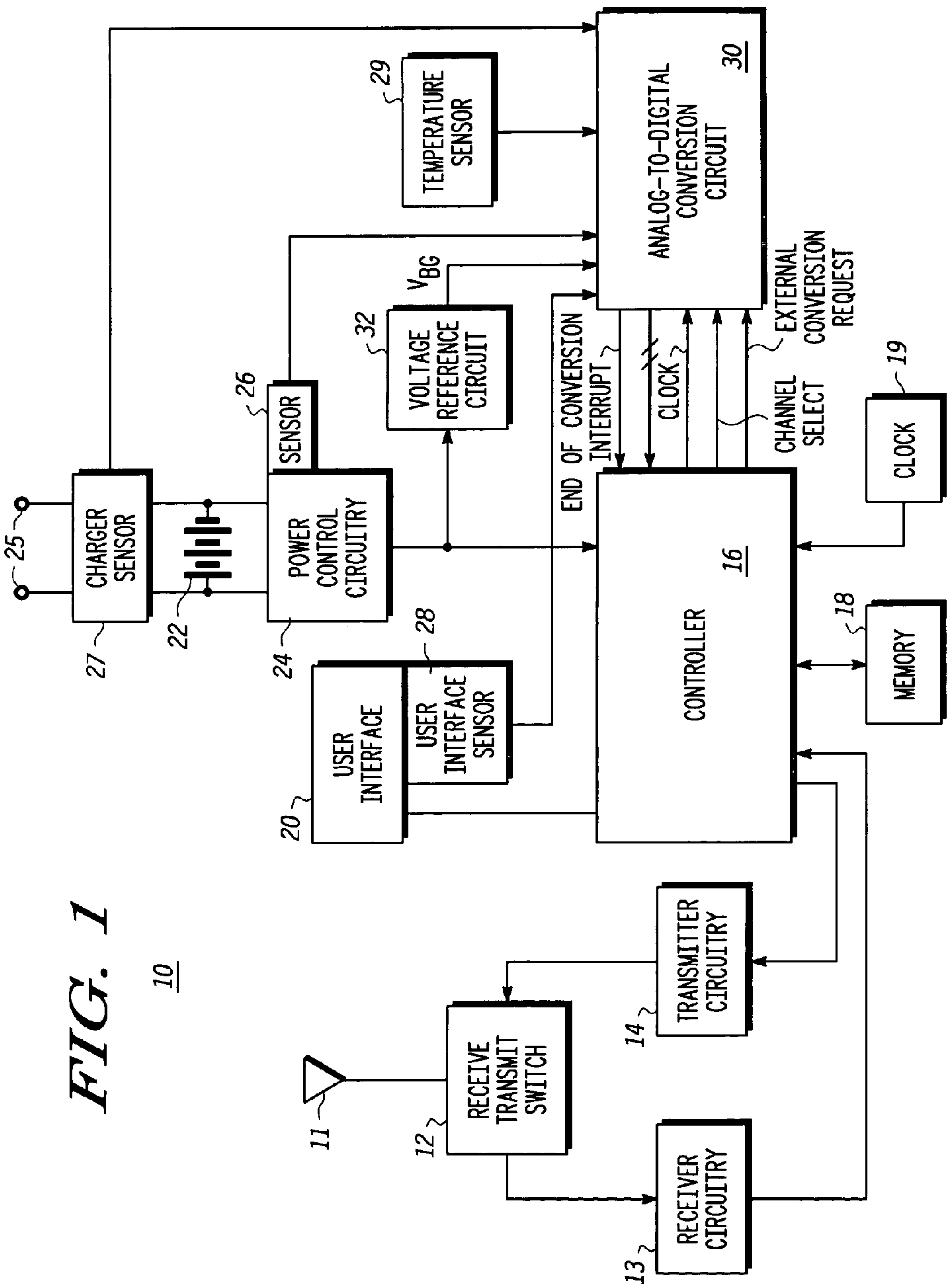
FIG. 1 is a block diagram of a portable electronic device in accordance with the preferred embodiment of the present invention.

Referring to FIG. 1, a block diagram of a portable electronic device 10, such as a cellular phone, in accordance with the preferred embodiment of the present invention is depicted. The portable electronic device 10 includes an antenna 11 for receiving and transmitting radio frequency (RF) signals. A receive/transmit switch 12 selectively couples the antenna 11 to receiver circuitry 13 and transmitter circuitry 14 in a manner familiar to those skilled in the art. The receiver circuitry 13 demodulates and decodes the RF signals to derive information therefrom and is coupled to a controller 16 for providing the decoded information thereto for utilization thereby in accordance with the function(s) of the portable electronic device 10. The controller 16 also provides information to the transmitter circuitry 14 for encoding and modulating information into RF signals for transmission from the antenna 11. As is well-known in the art, the controller is typically coupled to a memory device 18, a clock 19, a user interface 20, a battery 22 and power control circuitry 24 to perform the functions of the portable electronic device 10. The battery 22 is coupled to the components of the portable electronic device 10, such as the controller 16, the receiver and transmitter circuitry 14 and/or the user interface 20, through power control circuitry 24 to provide appropriate operational voltage and current to those components. In addition, the battery may be coupled to an external charger through terminals 25 to provide power to recharge the battery and/or operate the portable electronic device 10.

In accordance with the preferred embodiment of the present invention, one or more housekeeping sensors 26, 27, 28, 29 are utilized to sense various housekeeping states (e.g., operational conditions) of the portable electronic device to determine if the housekeeping states sensed are within predefined operational parameters. For example, at least one housekeeping sensor 26 could be coupled to the power control circuitry 24 to sense voltages, currents or other battery conditions. At least one housekeeping sensor 27 could also be coupled to terminals 25 to detect charging voltages or charging currents and to monitor the state of the charging operation. In addition, at least one housekeeping sensor 28 could be coupled to the user interface 20 to sense inputs thereto, such as touchscreen pressure points or user actuable switches. Also, at least one housekeeping sensor 29 could be a temperature sensor to monitor the temperature of the portable electronic device 10 and/or the various components thereof. While not shown in FIG. 1, it is understood that other housekeeping sensors could be coupled to other elements of the portable electronic device, such as the antenna 11, the receiver circuitry 13, the transmitter circuitry 14 or the case of the portable electronic device 10 to monitor the state(s) thereof.

Each of the housekeeping sensors 26, 27, 28, 29 is coupled to a housekeeping analog-to-digital conversion circuit 30. A stable voltage reference circuit 32 is coupled to the power control circuitry 24 and generates a stable reference signal for providing to the input of the analog-to-digital conversion circuit 30. The stable voltage reference circuit 32 and the stable voltage output should preferably be stable and not vary in response to temperature changes or changes of other external environment conditions, such that the output of the stable voltage reference circuit 32 can be used as a common baseline reference for the portable electronic device 10. The input of the analog-to-digital conversion circuit 30 is coupled to the controller 16 for receiving control signals therefrom as described below in reference to FIG. 2. The output of the analog-to-digital conversion circuit 30 is also coupled to the controller 16 for supplying an end-of-conversion interrupt signal and a digital housekeeping signal thereto.

Figure 2:
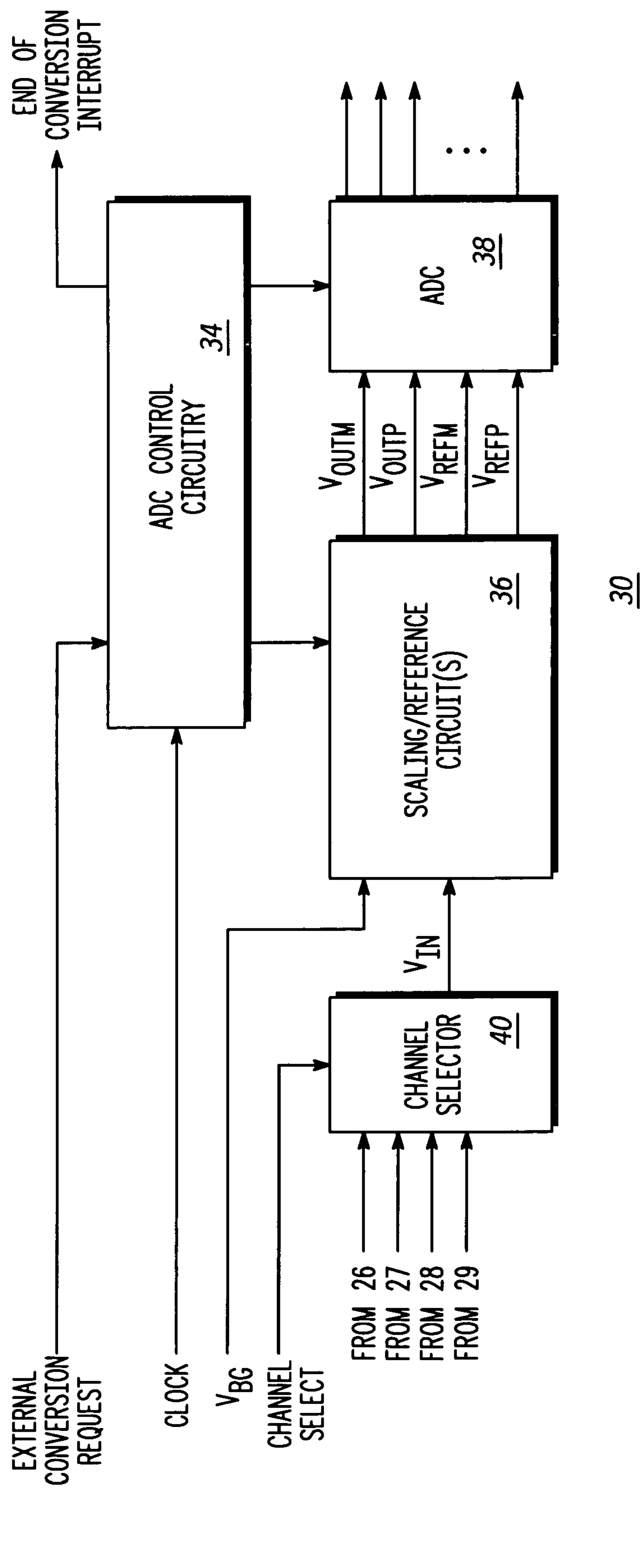
FIG. 2 is a block diagram of an analog-to-digital conversion circuit in accordance with the preferred embodiment of the present invention.

The operation of the housekeeping analog-to-digital conversion circuit 30 in accordance with the preferred embodiment of the present invention is described in reference to FIG. 2. Analog-to-digital converter (ADC) control circuitry 34 is coupled to a scaling/reference circuit 36 and an analog-to-digital converter (ADC) 38 for control thereof in response to a clock signal and an external conversion request signal received from the controller 16. Preferably, the housekeeping ADC conversion circuit 30 includes a redundant signed digit (RSD) cyclic analog-to-digital converter 38. An RSD-cyclic ADC is a type of algorithmic ADC and follows an algorithm to digitize the signal received. In accordance with the present invention, the algorithm of the ADC 38 can be summarized in C-like abstract as follows:

```
b=RSD_Cyclic(V_in, V_ref, n)
{
Begin
V_residue(l)=V_in;
```

-continued

```
For(i=1, n−1, i++)
{
If V_residue(i)≧V_ref/4 then
      P_comp = 1, Q_comp = 0;
      b(i) = 1;
      V_residue(i+1) = 2 × V_residue(i) − V_ref;
elseif V_residue(i)≦−V_ref/4 then
      P_comp = 0, Q_comp = 1;
      b(i) = 0;
      b(1 : i) = b(1 : i) − 1;
      V_residue(i+1) = 2 × Vresidue(i) + V_ref;
else
      P_comp = 0, Q_comp = 0;
      b(i) = 0;
      V_residue(i+1) = 2 × V_residue(i);
return(b);
end
}
```

The algorithm of ADC 38 shown above in C-like abstract can be summarized in the following five steps: first, sample the signal provided from the scaling/reference circuit 36; second, make a decision whether the signal is within one of three possible ranges ($\geqq V_{ref}/4$, $\leqq -V_{ref}/4$, or between $V_{ref}/4$ and $-V_{ref}/4$); third, based on the decision from step two compute the residual voltage by either (a) multiplying the input by two and subtracting $V_{ref}$, (b) multiplying the input by two and adding $V_{ref}$, or (c) multiplying the input by two; fourth, make the decision of step two on whether the computed residual voltage is within one of the three ranges; and fifth, repeat steps three and four n−2 more times with the computed residual voltage each time to obtain n-bit resolution. In accordance with the preferred embodiment of the present invention, a ten-bit resolution of the digital housekeeping signal is desired. Thus, ADC 38 would perform the algorithm to obtain the first bit, i.e., the most significant bit, by simultaneously sampling the input signal in accordance with step one and making the decision of step two on the input signal. Thereafter, ADC 38 performs the algorithm on each subsequent computed residual voltage.

The scaling/reference circuit 36 provides the input signals to the ADC 38. A first input of the scaling/reference circuit 36 is coupled to the stable voltage reference circuit 32 to provide a stable reference signal thereto and a second input is coupled to the output of a channel selector 40. The output of the housekeeping sensors 26, 27, 28, 29 are coupled to the channel selector 40 and upon a channel selection signal from the controller 16, the channel selector 40 selects one of the housekeeping signals to provide to the scaling/reference circuit 36.

In operation, the controller 16 signals the analog-to-digital conversion circuit to perform a conversion on a particular housekeeping signal such as the charger sensor 27 signal by providing an external conversion request signal to the ADC control circuitry 34 and a channel select signal to the channel selector 40. The housekeeping sensor 27 is sensing the charger state and generating an analog housekeeping signal in response to the housekeeping state of the charger. The analog housekeeping signal is provided to the channel selector 40 for provision to the second input of the ADC 30 in accordance with the channel select signal from the controller 16. The scaling/reference circuit 36 and the ADC 30 generate a digital housekeeping signal in response to the stable reference signal and the analog housekeeping signal under the control of the ADC control circuitry 34 in accordance with the clock signal from the controller 16 and provides and end-of-conversion interrupt and the bits of the digital housekeeping signal to the controller 16 for utilization thereby.

Figure 3:
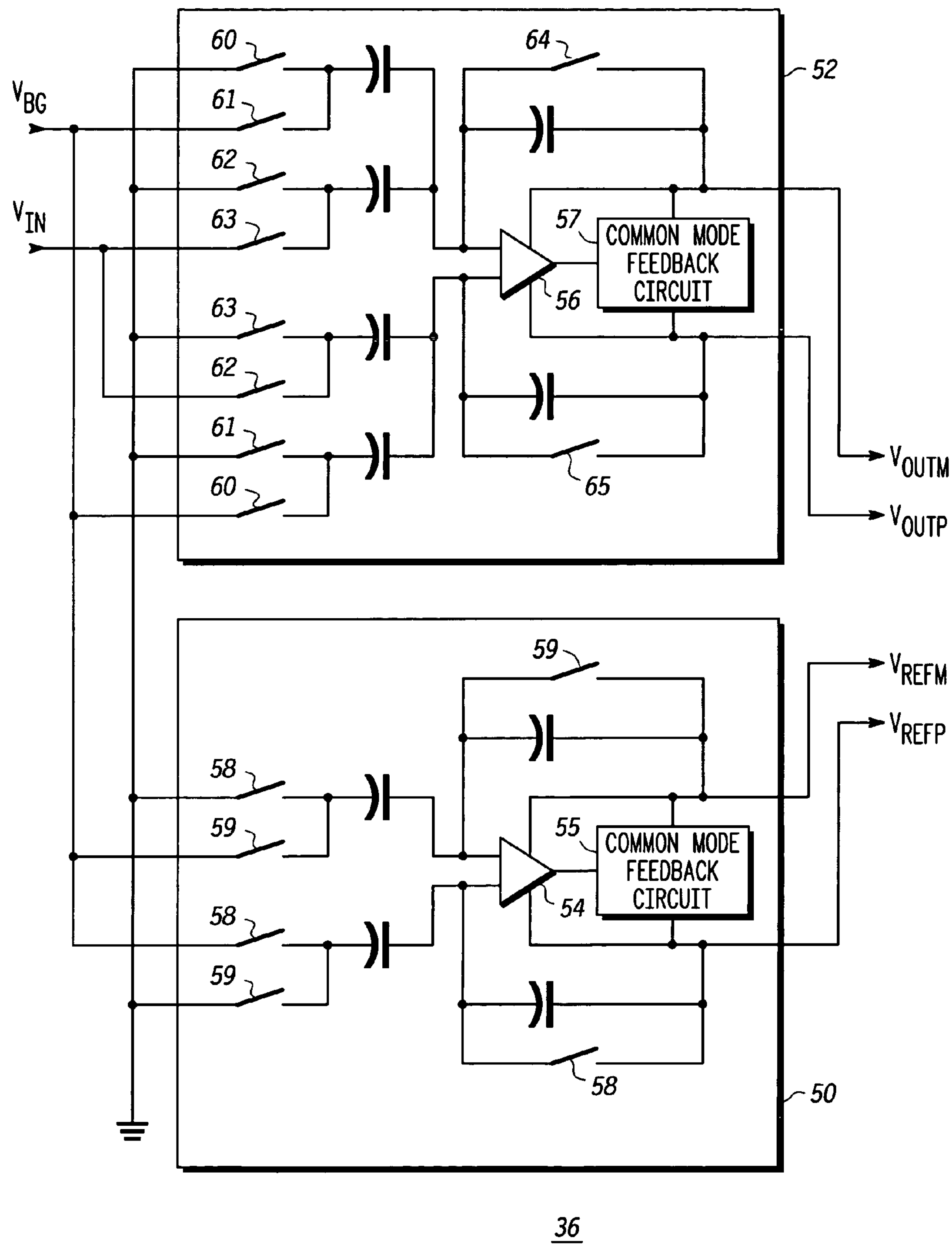
FIG. 3 is a circuit diagram of a conventional scaling circuit and reference circuit of the analog-to-digital conversion circuit.

Referring next to FIG. 3, a circuit diagram of a conventional scaling circuit and reference circuit of an analog-to-digital conversion circuit is depicted. The conventional scaling/reference circuit 36 contains a reference circuit 50 and a scaling circuit 52. The reference circuit 50 includes an operational amplifier 54 with two inputs couplable to the stable reference input, $V_{BG}$, from the stable voltage reference circuit 32 (FIG. 1) or ground and outputs coupled to a common-mode-feedback (CMFB) circuit 55. The scaling circuit 52 includes an operational amplifier 56 with two inputs couplable to either the stable reference input, $V_{BG}$, the analog housekeeping signal, $V_{IN}$, from one of the housekeeping sensors 26, 27, 28, 29 (FIG. 1) as selected by the channel selector 40 (FIG. 2), or ground and outputs coupled to a CMFB circuit 57. The operational amplifiers 54, 56 are differential-input differential-output amplifiers and CMFB circuits 55, 57 keep the output of the differential operational amplifiers 54, 56 symmetric around a known common-mode signal level. A plurality of switching elements 58, 59, 60, 61, 62, 63, 64, 65, typically switched capacitors, operate under the control of ADC control circuitry 34 (FIG. 2) to control the operation of the reference circuit 50 and the scaling circuit 52 during an ADC conversion time to provide the necessary signals to the ADC 38 (FIG. 2) to generate the digital housekeeping signal. The ADC 38 is typically a cyclic analog-to-digital converter 38 and each cycle of cyclic ADC 38 is the ADC conversion time which is composed of a number of phases corresponding to a predetermined number of bits of the digital housekeeping signal.

The reference circuit 50 is utilized to define the full scale of the ADC 38 by providing reference signals for the ADC 38 (i.e., an upper reference voltage limit, $V_{REFP}$, and a lower reference voltage limit, $V_{REFM}$, limit) in response to the stable reference input by control of switching elements 58, 59 so that the ADC 38 can assign the digital "one" value to signals having the full scale and any signal below full scale will be assigned a value equivalent to a ratio of the signal to the full scale. The scaling circuit 52 operates under the control of switching elements 62, 63, 64, 65 to scale the analog input, $V_{IN}$, to fit into the full scale of ADC 38 as defined in response to the stable reference voltage, $V_{BG}$, and perform single-ended to differential-ended conversion to derive the lower multiplexer limit, $V_{OUTM}$, and the upper multiplexer limit, $V_{OUTP}$. Thus, ADC 38 utilizes the four inputs $V_{OUTM}$, $V_{OUTP}$, $V_{REFM}$ and $V_{REFP}$ to generate the digital housekeeping signal.

Figure 4:
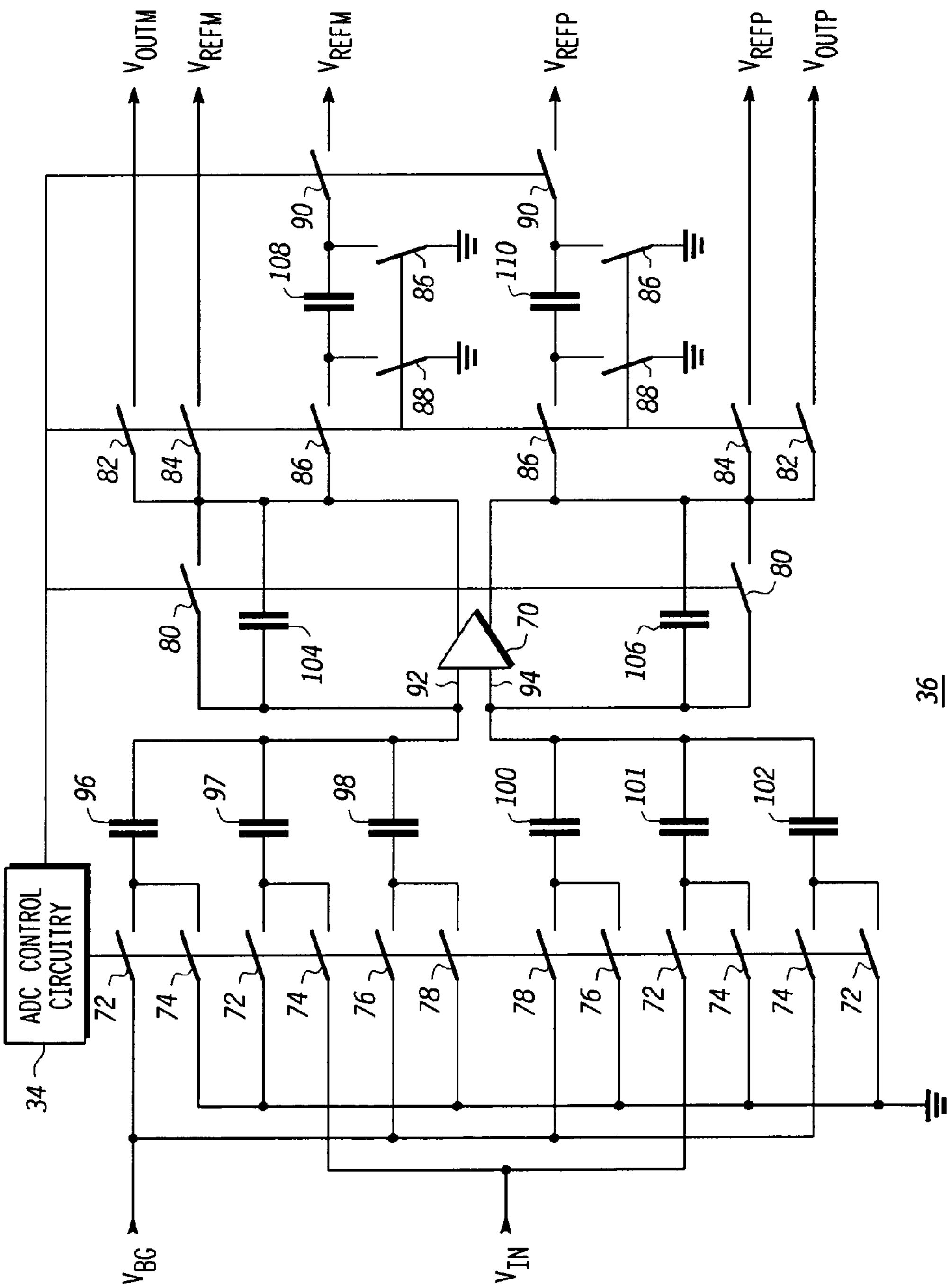
FIG. 4 is a circuit diagram of a scaling/reference circuit of the analog-to-digital conversion circuit in accordance with the preferred embodiment of the present invention.

Referring to FIG. 4, a circuit diagram of the scaling/reference circuit 36 (FIG. 2) in accordance with the preferred embodiment of the present invention is shown. The scaling/reference circuit 36 of the present invention includes a single operational amplifier 70 which can operate in either a reference generation mode or an analog multiplexing mode. As previously explained, the ADC 38 (FIG. 2) is preferably a one-bit cyclic analog-to-digital converter 38 and each cycle of cyclic ADC 38 is an ADC conversion time and is composed of a number of phases corresponding to a predetermined number of bits of the digital housekeeping signal. Preferably, the predetermined number of bits of the digital housekeeping signal, i.e., the resolution of the digital housekeeping signal, is ten. The ADC control circuitry 34 (FIG. 2) is coupled to a plurality of switching elements 72, 74, 76, 78, 80, 82, 84, 86, 88, 90, such as switched capacitors, to selectably couple the first and second inputs of the operational amplifier 70 to the stable reference signal and the analog housekeeping signal. Thus, the ADC control circuitry 34 controls the plurality of switching elements 72, 74, 76, 78, 80, 82, 84, 86, 88, 90 for the ADC 38 to generate the digital housekeeping signal by controlling the plurality of switching elements 72, 74, 76, 78, 80, 82, 84, 86, 88, 90 to operate the operational amplifier 70 in the reference generation mode and the analog multiplexing mode during a first of the plurality of phases of the ADC conversion time and to operate the operational amplifier in the analog multiplexing mode during subsequent ones of the plurality of phases of the ADC conversion time.

Preferably, the first bit of the ten bit digital housekeeping signal to be generated by the ADC 38 during each ADC conversion time is the most significant bit of the ten bits. During generation of the first bit of the digital housekeeping signal, the ADC control circuitry 34 controls the plurality of switching elements 72, 74, 76, 78, 80, 82, 84, 86, 88, 90 to operate the operational amplifier 70 in the reference generation mode by first coupling the operational amplifier 70 to the stable voltage reference circuit 32 (FIG. 1) to receive the stable reference signal, $V_{BG}$, and generating an upper reference voltage limit, $V_{REFP}$, and a lower reference voltage limit, $V_{REFM}$, in response thereto. Next, the ADC control circuitry 34 controls the plurality of switching elements 72, 74, 76, 78, 80, 82, 84, 86, 88, 90 to operate the operational amplifier 70 in the analog multiplexing mode by coupling the operational amplifier 70 to one of the housekeeping sensors 26, 27, 28, 29 as selected by the channel selector 40 (FIG. 2) to receive the analog housekeeping signal, $V_{IN}$, therefrom and generating an upper multiplexer output limit, $V_{OUTP}$, and a lower multiplexer output limit, $V_{OUTM}$, in response thereto and then coupling the operational amplifier 70 to the selected one of the housekeeping sensors 26, 27, 28, 29 for the ADC 38 to generate the first bit signal in response to the analog housekeeping signal, $V_{IN}$, the upper reference voltage limit, $V_{REFP}$, the lower reference voltage limit, $V_{REFM}$, the upper multiplexer output limit, $V_{OUTP}$, and the lower multiplexer output limit, $V_{OUTM}$.

For generation of the second through tenth bits of the digital housekeeping signal, the ADC control circuitry 32 controls the plurality of switching elements 72, 74, 76, 78, 80, 82, 84, 86, 88, 90 to operate the operational amplifier 70 in the analog multiplexing mode by coupling the operational amplifier 70 to the selected one of the housekeeping sensors 26, 27, 28, 29 to receive the analog housekeeping signal, $V_{IN}$, therefrom and generating an upper reference voltage limit, $V_{REFP}$, and a lower reference voltage limit, $V_{REFM}$, in response to the analog housekeeping signal and then coupling the operational amplifier 70 to the selected one of the housekeeping sensors 26, 27, 28, 29 to generate the second through the tenth bit signals in response to the analog housekeeping signal, $V_{IN}$, the upper reference voltage limit, $V_{REFP}$, and the lower reference voltage limit, $V_{REFM}$.

The plurality of switching elements 72, 74, 76, 78, 80, 86, 88, 90 are a plurality of switched capacitative elements, i.e., capacitors which are selectably operable, such as coupling one or more inputs to capacitors and thence to the first input 92 or second input 94 of operational amplifier 70. Capacitors 96, 97 and 98 are coupled to the first input 92 of operational amplifier 70 and, as controlled by switching elements 72, 74, 76 and 78, are couplable to either a common mode voltage from stable voltage source 32, $V_{BG}$, ground, or the selected analog housekeeping signal, $V_{IN}$. Capacitors 100, 101 and 102 are coupled to the second input 94 of operational amplifier 70 and, as controlled by switching elements 72, 74, 76 and 78, are likewise couplable to $V_{BG}$, ground or $V_{IN}$. Switching elements 80 control the operational mode of the operational amplifier 70 by selectably coupling capacitors 104 and 106 between the inputs 92, 94 and the outputs of operational amplifier 70.

In accordance with the preferred embodiment of the present invention, switching elements 82 selective provide high and low outputs from the operational amplifier 70 when operating in the analog multiplexing mode and switching elements 84 selective provide high and low outputs from the operational amplifier 70 when operating in the reference generation mode. Since the scaled and reference outputs are required simultaneously for generation of the first bit of the digital housekeeping signal, the ADC control circuitry 34 of the present invention advantageously controls switching elements 86, 88 and 90 to selectably couple capacitors 110 and 108 to temporarily store an upper reference voltage limit, $V_{REFP}$, and a lower reference voltage limit, $V_{REFM}$, generated in the voltage reference mode and thereafter controls switching elements 82 and 84 to provide the upper reference voltage limit, $V_{REFP}$, the lower reference voltage limit, $V_{REFM}$, the upper multiplexer output limit, $V_{OUTP}$, and the lower multiplexer output limit, $V_{OUTM}$, to the ADC 38.

Figure 5:
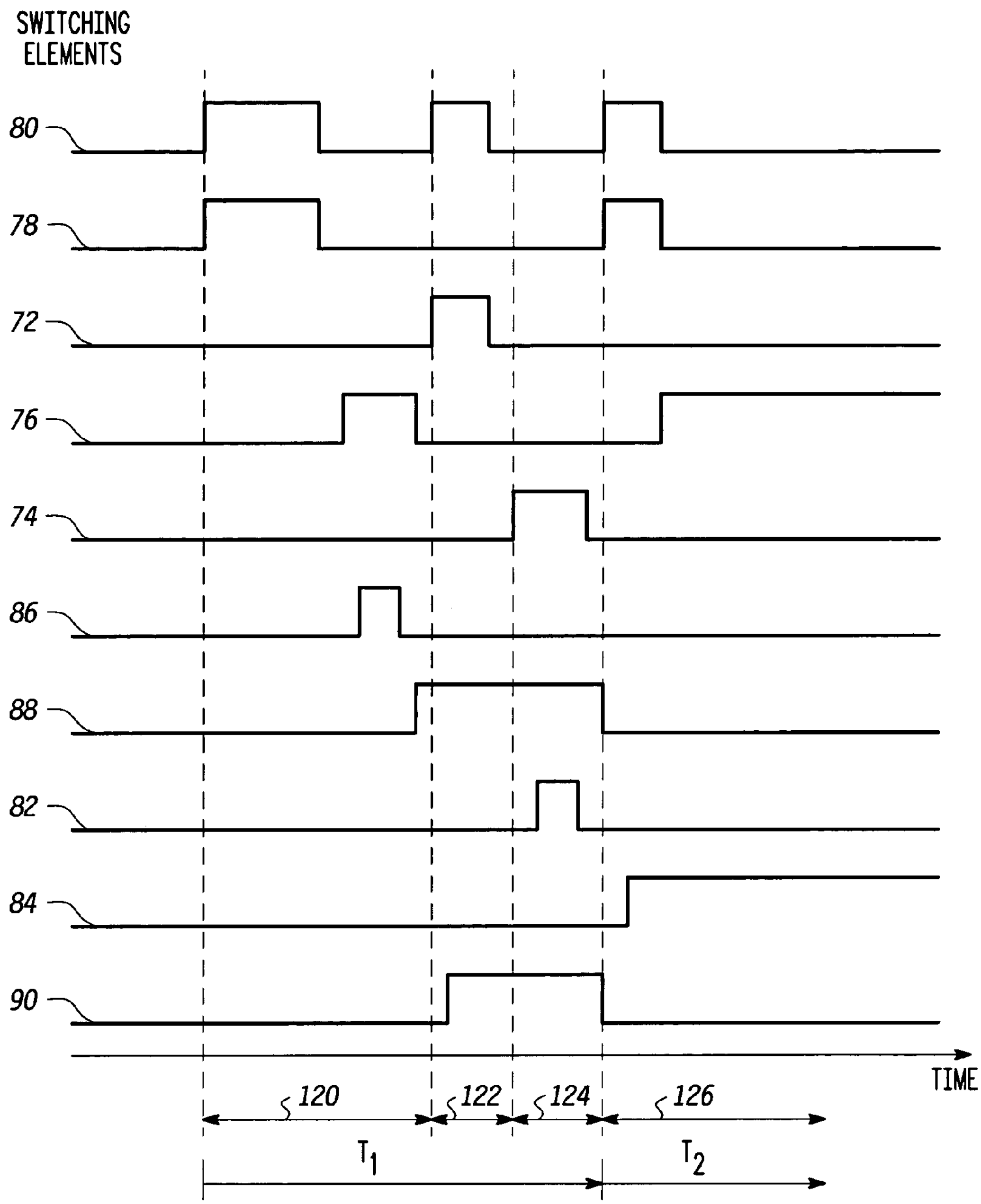
FIG. 5 is a timing diagram describing the operation of the analog-to-digital controller in accordance with the preferred embodiment of the present invention.

Referring to FIG. 5, the operation of the scaling/reference circuit 36 of FIG. 4 in accordance with the preferred embodiment of the present invention is described in relation to a timing diagram showing the operation of the switching elements 72, 74, 76, 78, 80, 82, 84, 86, 88 and 90. To facilitate understanding of the timing diagram of FIG. 5, it is understood that when the timing line goes high for a particular switching element, that switching element is closed and remains closed until the timing line goes low.

As described previously, in accordance with the present invention, the analog-to-digital converter (ADC) 38 is a cyclic ADC. An ADC conversion time is defined as the time duration of one cycle of the cyclic ADC 38 and the ADC conversion time is made up of a plurality of phases. Each phase corresponds to a bit of the digital housekeeping signal generated by the ADC 38 and, in accordance with the present invention, the digital housekeeping signal is a ten bit signal. Referring to the timing diagram of FIG. 5, during the time, $T_1$, of the first of the plurality of phases, the scaling/reference circuit 36 operates in the reference generation mode 120 and the analog multiplexing mode 122, 124 to apply appropriate signals to the ADC 38 to generate the first bit of the digital housekeeping signal. During the subsequent ones (e.g., two through ten) of the plurality of phases, $T_2$, the scaling/reference circuit 36 operates in the analog multiplexing mode 126 to apply appropriate signals to the ADC 38 to generate the subsequent bits (e.g., two through ten) of the digital housekeeping signal.

In operation, to generate the first bit of the ten bit digital housekeeping signal, the scaling/reference circuit 36 operates in the reference generation mode during time 120 and, first, switching elements 80 are closed to place the operational amplifier in a upper voltage limit generation mode and switching elements 78 are closed to couple the first input 92 of operational amplifier 70 to ground and the second input 94 of operational amplifier 70 to $V_{BG}$. Then, switching elements 80 are opened to place the operational amplifier in minus generating mode. Switching elements 78 are opened and thereafter switching elements 76 are closed to reverse the first and second inputs 92, 94. In this manner, an upper reference voltage limit, $V_{REFP}$, and a lower reference voltage limit, $V_{REFM}$, are generated from the stable reference input, $V_{BG}$. Switching elements 86 are temporarily closed to store $V_{REFP}$ in capacitor 110 and $V_{REFM}$ in capacitor 108. Thereafter, switching elements 86 are opened and switching elements 88 are closed to latch $V_{REFP}$ and $V_{REFM}$ in capacitors 110 and 108, respectively.

Next, the scaling/reference circuit 36 operates in the analog multiplexing mode 122, 124. Switching elements 80, 72 and 74 are operated to couple the first and second input 92, 94 to the analog multiplexer input, $V_{IN}$, from the selected one of the housekeeping sensors 26, 27, 28, 29 to generate an upper multiplexer output limit, $V_{OUTP}$, and a lower multiplexer output limit, $V_{OUTM}$. When switching elements 72 are closed, the first input 92 of the operational amplifier 70 is coupled to ground and $V_{BG}$ coupled in parallel through capacitors 96 and 97 and the second input 94 of operational amplifier 70 is coupled to VN and ground coupled in parallel through capacitors 101 and 102 and switching elements 80 are closed to place the operational amplifier 70 in the upper voltage limit generation mode for generation of the upper multiplexer output limit, $V_{OUTP}$, scaled by the reference voltage, $V_{BG}$. The values $V_{REFM}$ and $V_{REFP}$ are unlatched from capacitors 108 and 110 by closing switching elements 90 and provided to the output. Then, switching elements 80 are opened to place the operational amplifier 70 in the lower voltage limit generation mode and, during analog multiplexing mode 124, switching elements 74 are closed to couple the first input 92 to ground and $V_{IN}$ coupled in parallel through capacitors 96 and 97 and to couple the second input 94 to $V_{BG}$ and ground coupled in parallel through capacitors 101 and 102. And switching elements 82 are closed to provide the upper multiplexer output limit, $V_{OUTP}$, and a lower multiplexer output limit, $V_{OUTM}$, to the output. The ADC 38, thus makes the decision whether the first bit, preferably the most significant bit, of the digital housekeeping signal is a digital "0" or a digital "1" in response to the analog multiplexer input, $V_{IN}$, the upper reference voltage limit, $V_{REFP}$ the lower reference voltage limit, $V_{REFM}$, the upper multiplexer output limit, $V_{OUTP}$, and the lower multiplexer output limit, $V_{OUTM}$, received from the output of the scaling/reference circuit 36.

Subsequent ones of the bits of the digital housekeeping signal are generated during time $t_2$ in analog multiplexing mode 126. First, switching elements 80 and 78 are operated to couple the first and second inputs 92, 94 of operational amplifier 70 to the analog multiplexer input from the selected one of the housekeeping sensors 26, 27, 28, 29 to generate an upper reference voltage limit, $V_{REFP}$, and a lower reference voltage limit, $V_{REFM}$. When switching elements 80 and 78 are closed, the first input 92 of the operational amplifier 70 is coupled to ground through capacitor 98 and the second input 94 is coupled to $V_{BG}$ through capacitor 100 and the operational amplifier 70 is operating in the upper voltage limit generation mode. Thereafter, switching elements 84 are closed to provide the values $V_{REFM}$ and $V_{REFP}$ to the ADC 38. Next, switching elements 80 are opened to place the operational amplifier in the lower voltage limit generation mode and switching elements 78 are opened and switching elements 76 are closed to couple the first input 92 to $V_{BG}$ through capacitor 98 and the second input 94 to ground through capacitor 100. In this manner, the ADC 38 makes the decision whether the subsequent bits of the digital housekeeping signal are a digital "0" or a digital "1" in response to the analog multiplexer input, $V_{IN}$, the upper reference voltage limit, $V_{REFP}$ and the lower reference voltage limit, $V_{REFM}$ as received from the scaling/reference circuit 36.

Thus, it can be seen that the present invention advantageously reduces the number of components in of the ADC conversion circuit. In addition, the present invention reduces the power consumption of the ADC conversion circuit.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method for analog-to-digital conversion in a cyclic analog-to-digital conversion (ADC) circuit having an input and an output, the input selectable between a stable reference input and an analog multiplexer input, and having an ADC conversion time corresponding to a time duration required to generate a predetermined number of bits and comprising a plurality of phases corresponding to the predetermined number of bits, wherein the cyclic ADC circuit comprises a scaling/reference circuit having an operational amplifier operating in a reference voltage generation mode and an analog multiplexing mode, the method comprising the steps of:

during a first of the plurality of phases operating the operational amplifier in the reference voltage generation mode and the analog multiplexing mode to generate a first bit of the predetermined number of bits for providing to the output; and during subsequent ones of the plurality of phases operating the operational amplifier in the analog multiplexing mode to generate subsequent bits of the predetermined number of bits for providing to the output, each of the subsequent bits corresponding to each of the subsequent ones of the plurality of phases.

2. The method of claim 1 wherein the plurality of phases corresponds to a plurality of cycles of the cyclic ADC circuit.

3. The method of claim 1 wherein the first bit of the predetermined number of bits corresponds to a most significant bit of the predetermined number of bits.

4. The method of claim 1 wherein the step of generating the first bit of the predetermined number of bits comprises the steps of:

selecting the stable reference input;

generating from the stable reference input an upper reference voltage limit and a lower reference voltage limit;

selecting the analog multiplexer input;

generating from the analog multiplexer input an upper multiplexer output limit and a lower multiplexer output limit; and generating the first bit of the predetermined number of bits in response to the analog multiplexer input, the upper reference voltage limit, the lower reference voltage limit, the upper multiplexer output limit, and the lower multiplexer output limit.

5. The method of claim 1 wherein the step of generating the subsequent ones of the predetermined number of bits comprises the steps of:

generating from the analog multiplexer input an upper reference voltage limit and a lower reference voltage limit; and generating the subsequent one of the predetermined number of bits in response to the analog multiplexer input, the upper reference voltage limit, and the lower reference voltage limit.

6. An analog-to-digital conversion circuit comprising:

a scaling/reference circuit selectably couplable between a first input and a second input for generating an output in response to at least one of the first input and the second input;

an analog-to-digital converter (ADC) coupled to the scaling/reference circuit for receiving the output therefrom and generating a digital housekeeping signal in response to the output; and ADC control circuitry coupled to the scaling/reference circuit and the ADC for controlling the operation thereof, wherein the scaling/reference circuit comprises:

an operational amplifier selectably couplable between the first input and the second input for operating in a reference generation mode and an analog multiplexing mode; and a plurality of switching elements coupled to the input and the output of the operational amplifier, and wherein the ADC control circuitry is coupled to the plurality of switching elements for operating the scaling/reference circuit in an ADC conversion time having a plurality of phases, the ADC control circuitry coupling various ones of the plurality of switching elements to the operational amplifier and uncoupling various ones of the plurality of switching elements from the operational amplifier to operate the operational amplifier in the reference generation mode and the analog multiplexing mode during a first of the plurality of phases and to operate the operational amplifier in the analog multiplexing mode during subsequent ones of the plurality of phases.

7. The analog-to-digital conversion circuit of claim 6 wherein the ADC is a cyclic ADC and wherein the ADC conversion time corresponds to operating the cyclic ADC for one cycle.

8. The analog-to-digital conversion circuit of claim 6 wherein the ADC conversion time corresponds to a time duration required to generate a predetermined number of bits and wherein the plurality of phases corresponds to the predetermined number of bits, and wherein the ADC control circuitry controls the plurality of switching elements to operate the operational amplifier during the first of the plurality of phases in the reference generation mode and the analog multiplexing mode to generate a first bit of the predetermined number of bits and to operate the operational amplifier during subsequent ones of the plurality of phases in the analog multiplexing mode to generate subsequent bits of the predetermined number of bits.

9. The analog-to-digital conversion circuit of claim 8 wherein the first bit of the predetermined number of bits corresponds to a most significant bit of the predetermined number of bits.

10. The analog-to-digital conversion circuit of claim 6 wherein the ADC control circuitry is coupled to the plurality of switching elements to selectably couple the input of the operational amplifier to a stable reference input or an analog multiplexer input.

11. The analog-to-digital conversion circuit of claim 10 wherein the ADC control circuitry controls the plurality of switching elements to enable the ADC to generate the first bit in response to the analog multiplexer input, an upper reference voltage limit, a lower reference voltage limit, an upper multiplexer output limit, and a lower multiplexer output limit by first coupling the operational amplifier of the scaling/reference circuit to the stable reference input and generating the upper reference voltage limit and the lower reference voltage limit to provide to the ADC, then coupling the operational amplifier to the analog multiplexer input and generating the upper multiplexer output limit and the lower multiplexer output limit to provide to the ADC, and thereafter coupling the operational amplifier to the analog multiplexer input to provide to the ADC for generation of the first bit.

12. The analog-to-digital conversion circuit of claim 10 wherein the ADC control circuitry controls the plurality of switching elements to generate the subsequent ones of the predetermined number of bits in response to an analog multiplexer input, an upper reference voltage limit, and a lower reference voltage limit by coupling the operational amplifier of the scaling/reference circuit to the analog multiplexer input for generating the upper reference voltage limit and the lower reference voltage limit to provide to the ADC, then the ADC generating therefrom the subsequent ones of the predetermined number of bits.

13. A portable electronic device comprising:

a stable voltage reference circuit for generating a stable reference signal;

at least one housekeeping sensor for sensing a housekeeping state and generating an analog housekeeping signal in response thereto;

a housekeeping cyclic analog-to-digital conversion (ADC) circuit coupled to the stable voltage reference circuit and the at least one housekeeping sensor for generating a digital housekeeping signal in response thereto; and a controller coupled to the at least one housekeeping cyclic ADC circuit for controlling operation of the portable electronic device in response to the digital housekeeping signal, wherein the housekeeping cyclic ADC comprises:

a scaling/reference circuit, the scaling/reference circuit including an operational amplifier for operating in a reference generation mode and an analog multiplexing mode and a plurality of switching elements coupled to the operational amplifier for selectably coupling an input of the operational amplifier to the stable voltage reference circuit and the at least one housekeeping sensor for the operational amplifier to selectably receive the stable reference signal or the analog housekeeping signal;

an analog-to-digital controller coupled to the scaling/reference circuit to receive the output thereof and generate the digital housekeeping signal in response thereto; and ADC control circuitry coupled to the plurality of switching elements for operating the plurality of switching elements to generate the digital housekeeping signal, the ADC control circuitry controlling the plurality of switching elements to operate the operational amplifier in a reference generation mode and an analog multiplexing mode during a first of a plurality of phases of an ADC conversion time and to operate the operational amplifier in the analog multiplexing mode during subsequent ones of the plurality of phases of the ADC conversion time.

14. The portable electronic device of claim 13 wherein the plurality of switching elements comprises a plurality of switched capacitative elements.

15. The portable electronic device of claim 13 wherein the digital housekeeping signal comprises a predetermined number of bits.

16. The portable electronic device of claim 15 wherein the predetermined number of bits is ten.

17. The portable electronic device of claim 15 wherein the ADC control circuitry controls the plurality of switching elements during the first of the plurality of phases to generate a first bit of the predetermined number of bits by first coupling the operational amplifier to the stable voltage reference circuit and generating an upper reference voltage limit and a lower reference voltage limit in response to the stable reference signal for providing to the analog-to-digital controller, then coupling the operational amplifier to the at least one housekeeping sensor and generating an upper multiplexer output limit and a lower multiplexer output limit in response to the analog housekeeping signal for providing to the analog-to-digital controller, and thereafter coupling the operational amplifier to the at least one housekeeping sensor thereby enabling the analog-to-digital controller to generate the first bit in response to the analog housekeeping signal, the upper reference voltage limit, the lower reference voltage limit, the upper multiplexer output limit, and the lower multiplexer output limit.

18. The portable electronic device of claim 15 wherein the ADC control circuitry controls the plurality of switching elements during subsequent ones of the plurality of phases to generate subsequent bits of the predetermined number of bits by coupling the operational amplifier to the housekeeping sensor for generating an upper reference voltage limit and a lower reference voltage limit in response to the analog housekeeping signal for providing to the analog-to-digital controller, thereby enabling the analog-to-digital controller to generate the subsequent ones of the predetermined number of bits in response to the analog housekeeping signal, the upper reference voltage limit, and the lower reference voltage limit.

* * * * *